(12) United States Patent
Desai et al.

(10) Patent No.: US 9,124,257 B2
(45) Date of Patent: Sep. 1, 2015

(54) DIGITAL CLOCK PLACEMENT ENGINE APPARATUS AND METHOD WITH DUTY CYCLE CORRECTION AND QUADRATURE PLACEMENT

(75) Inventors: Jayen J. Desai, Wellington, CO (US); Erin Francom, Fort Collins, CO (US); Matthew Peters, Fort Collins, CO (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/976,945

(22) PCT Filed: Dec. 29, 2011

(86) PCT No.: PCT/US2011/067953
§ 371 (c)(1),
(2), (4) Date: Jun. 27, 2013

(87) PCT Pub. No.: WO2013/101117
PCT Pub. Date: Jul. 4, 2013

(65) Prior Publication Data
US 2014/0203851 A1  Jul. 24, 2014

(51) Int. Cl.
| H03K 5/15 | (2006.01) |
| H03K 5/156 | (2006.01) |
| H03K 7/08 | (2006.01) |
| H03K 9/08 | (2006.01) |
| G11C 7/22 | (2006.01) |

(52) U.S. Cl.
CPC .............. *H03K 5/1565* (2013.01); *H03K 7/08* (2013.01); *H03K 9/08* (2013.01); *G11C 7/22* (2013.01)

(58) Field of Classification Search
CPC ........... H03K 7/08; H03K 9/08; H03H 11/16; H03H 11/20; H03H 11/22
See application file for complete search history.

(56) References Cited

U.S. PATENT DOCUMENTS

| 7,081,783 | B2 * | 7/2006 | Berkram et al. | 327/238 |
| 7,368,966 | B2 | 5/2008 | Hur | |
| 7,598,786 | B2 | 10/2009 | Cheng | |
| 8,274,318 | B2 * | 9/2012 | Lee | 327/175 |
| 8,344,772 | B2 * | 1/2013 | Lee et al. | 327/156 |
| 8,392,744 | B2 * | 3/2013 | Lin | 713/500 |
| 8,466,726 | B2 * | 6/2013 | Satoh et al. | 327/175 |
| 8,483,344 | B2 * | 7/2013 | Dillinger | 375/371 |
| 8,552,780 | B2 * | 10/2013 | Zohner et al. | 327/231 |
| 2002/0157031 | A1 * | 10/2002 | Lin | 713/401 |

(Continued)

OTHER PUBLICATIONS

International Search Report and Written Opinion mailed Sep. 27, 2012 for International Application No. PCT/US2011/067953, 12 pages.

(Continued)

*Primary Examiner* — Thomas J Hiltunen
(74) *Attorney, Agent, or Firm* — Schwabe Williamson & Wyatt PC

(57) ABSTRACT

A digital clock placement engine has circuitry that adjusts a duty cycle of a clock signal and adjusts the locations of the rising/falling edges of the clock signal for purposes of data sampling or other operations. In a forwarded-clock interface implementation, a clock signal is received along with a data signal, and the received clock signal may be distorted to due various factors. To enable the received data signal to be sampled correctly, the clock placement engine generates a recovered clock signal having rising and falling edges that are placed/timed between the rising and falling edges of the received clock signal.

19 Claims, 5 Drawing Sheets

(56) References Cited

U.S. PATENT DOCUMENTS

| | | | |
|---|---|---|---|
| 2004/0158420 A1* | 8/2004 | Kim et al. | 702/66 |
| 2004/0161068 A1* | 8/2004 | Zerbe et al. | 375/355 |
| 2006/0034408 A1 | 2/2006 | Lin | |
| 2006/0129868 A1* | 6/2006 | Matsumoto et al. | 713/500 |
| 2007/0097752 A1* | 5/2007 | Penney | 365/189.05 |
| 2007/0286320 A1* | 12/2007 | Jiang | 375/371 |
| 2008/0150601 A1 | 6/2008 | Nonaka | |
| 2009/0167387 A1* | 7/2009 | Kim | 327/157 |
| 2009/0278580 A1* | 11/2009 | Kim | 327/158 |
| 2011/0215851 A1 | 9/2011 | Oh et al. | |
| 2011/0227618 A1* | 9/2011 | Miyano | 327/158 |
| 2011/0267124 A1 | 11/2011 | Kim et al. | |
| 2013/0229216 A1* | 9/2013 | WU et al. | 327/175 |
| 2013/0335126 A1* | 12/2013 | Chaivipas | 327/175 |

OTHER PUBLICATIONS

International Preliminary Report on Patentability for PCT Application No. PCT/US2011/067953, dated Jul. 10, 2014.

* cited by examiner

| DCS | | QLS | | Delay Line Reaction | |
|---|---|---|---|---|---|
| CLK_REC Low Time Too Large | CLK_REC Low Time Too Small | T1<T2 | T1>T2 | | |
| 0 | 0 | 0 | 0 | Do nothing | |
| 0 | 0 | 0 | 1 | R early & F early | ← 602 |
| 0 | 0 | 1 | 0 | R later & F later | ← 604 |
| 0 | 0 | 1 | 1 | Illegal | |
| 0 | 1 | 0 | 0 | F early | ← 606 |
| 0 | 1 | 0 | 1 | F early | ← 608 |
| 0 | 1 | 1 | 0 | R later | ← 610 |
| 0 | 1 | 1 | 1 | Illegal | |
| 1 | 0 | 0 | 0 | F later | ← 612 |
| 1 | 0 | 0 | 1 | R early | ← 614 |
| 1 | 0 | 1 | 0 | F later | ← 616 |
| 1 | 0 | 1 | 1 | Illegal | |
| 1 | 1 | 0 | 0 | Illegal | |
| 1 | 1 | 0 | 1 | Illegal | |
| 1 | 1 | 1 | 0 | Illegal | |
| 1 | 1 | 1 | 1 | Illegal | |

DIGITAL CLOCK PLACEMENT ENGINE APPARATUS AND METHOD WITH DUTY CYCLE CORRECTION AND QUADRATURE PLACEMENT

CROSS REFERENCE TO RELATED APPLICATION

The present application is a national phase entry under 35 U.S.C. §371 of International Application No. PCT/US2011/067953, filed Dec. 29, 2011, entitled "DIGITAL CLOCK PLACEMENT ENGINE APPARATUS AND METHOD WITH DUTY CYCLE CORRECTION AND QUADRATURE PLACEMENT," which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to a circuit to provide a clock signal that has a more optimal duty cycle and a more optimal location/placement of its rising and falling edges.

BACKGROUND INFORMATION

Electronic circuits often use a clock signal to control the timing of various operations. For example, the sampling of a data signal can be triggered according to the rising and/or falling edges of a clock signal.

In an electronic system, certain characteristics (such as duty cycle, phase and timing, etc.) of clock signals may be affected by jitter, by skew caused by circuitry in the electronic system, by circuit aging, by temperature changes, by a variety of different noise sources, by process variations in the elements that are present in the electronic system, or by other factors. These factors can thus cause a clock signal to be defective or otherwise non-ideal in that the clock signal may have a less-than-optimum duty cycle, phase or timing, etc.

The defective nature of the clock signal can in turn cause erroneous operation in the electronic system. For example, data sampling that is performed according to the defective clock signal can cause the data signal to be erroneously read (e.g., missed samples, extra samples, irregular sampling, etc.).

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Figure 1:
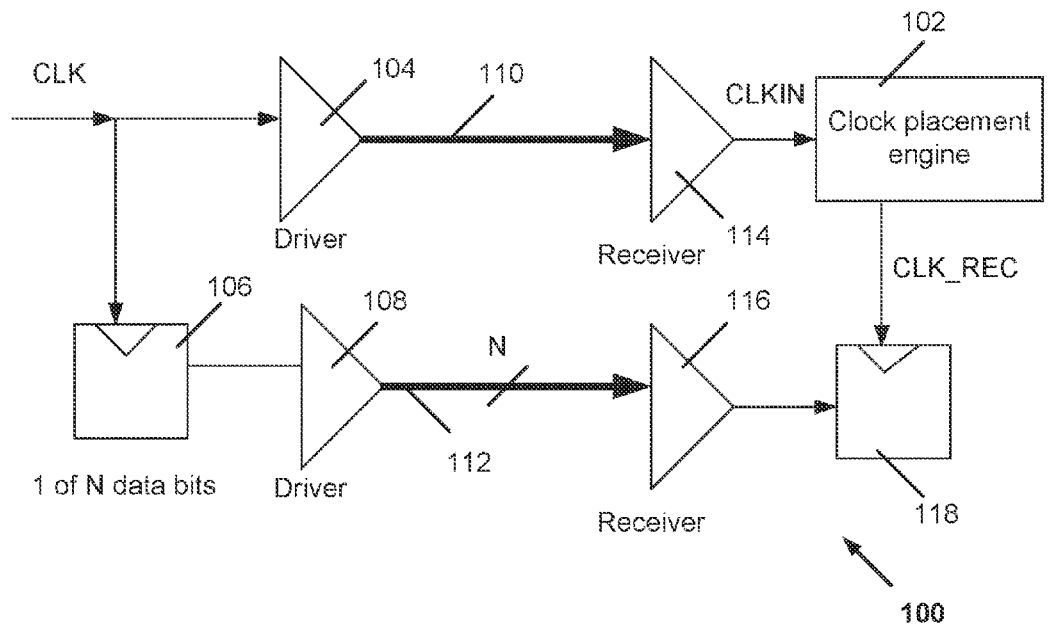
FIG. 1 illustrates a system that can implement a clock placement engine that provides a recovered clock signal having a corrected duty cycle and adjusted placement of rising/falling edges, in accordance with one embodiment.

Embodiments of a circuit and method to provide a recovered clock signal that has an adjusted duty cycle and adjusted placement of its rising/falling edges are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides a clock placement engine having circuitry that adjusts a duty cycle of a clock signal and adjusts the locations of the rising/falling edges of the clock signal such that data sampling (that is based on the clock signal) can be performed at optimal times. For example in a forwarded-clocked interface implementation, a clock signal is sent along with one or more data signals. After the clock signal is received, the clock signal may be delayed to due various factors including the distribution of that clock signal to one or more data receivers. To enable the received data signal to be sampled correctly, the clock placement engine generates a recovered clock signal having rising and falling edges that are placed/timed to occur between the rising and falling edges of the received clock signal.

The placement of the rising and falling edges of the recovered clock signal at these locations relative to the received clock signal enables the data sampling/samples, performed at the rising and falling edges of the recovered clock signal, to be maximally distanced from the rising and falling edges of the received clock signal. Since the data signal tracks or otherwise corresponds to the received clock signal, the data sampling performed at or triggered at the rising/falling edges of the recovered clock signal will also be maximally distanced from potential rising/falling edges of the data signal, thereby leading to optimal data sampling. Furthermore, the clock placement engine of one embodiment, by placing/locating/timing the rising/falling edges of the recovered clock signal in the middle between rising/falling edges of the received clock signal (e.g., a quadrature or 90-degree phase shift), enables the recovered clock signal to have a 50% duty cycle.

In one embodiment, the clock placement engine can have/provide a digital implementation using digital circuitry, as opposed to using analog circuitry.

One embodiment provides an apparatus that includes: a delay line configured to receive a clock signal and to output a recovered clock signal, the delay line having a delay value that is usable to adjust timing of at least one edge of the recovered clock signal relative to the received clock signal; and a finite state machine (FSM) coupled to the delay line and configured to generate a code and to provide the generated code to the delay line to select the delay value.

According to one embodiment of the apparatus, the delay line is configured to use the delay value to adjust timing of a rising edge and a falling edge of the recovered clock signal relative to the received clock signal. According to one embodiment of the apparatus, the delay line is configured to time the rising edge of the recovered clock signal to occur in a middle between a rising edge of the received clock signal and an immediate falling edge of the received clock signal; and the delay line is configured to time the falling edge of the recovered clock signal to occur in a middle between the falling edge of the received clock signal and an immediate rising edge of the received clock signal. According to one embodiment of the apparatus, the delay line is configured to use the delay value to adjust a duty cycle of the recovered clock signal to a 50% duty cycle.

According to one embodiment, apparatus further includes: a first instance of a measurement structure coupled to the delay line and to the FSM, and configured to monitor a duty cycle of the recovered clock signal that is output by the delay line and to provide a first output to the FSM that represents the monitored duty cycle; and a second instance of the measurement structure coupled to the delay line and to the FSM, and configured to monitor edge placement of the recovered clock signal relative to the received clock signal and to provide a second output to the FSM that represents the monitored edge placement; wherein the FSM is responsive to the first and second outputs to generate the code to provide to the delay line to select the delay value.

According to one embodiment of the apparatus, the measurement structure is configured to evaluate versions of the received clock signal alone or the recovered clock signal and the recovered clock signal with each other to generate the first and second outputs respectively. According to one embodiment of the apparatus, the measurement structure includes first and second multiplexers configured to receive the versions of the received clock signal and of the recovered clock signal, and wherein the FSM is further configured to provide a selection signal to the first and second multiplexers to enable selection of particular versions of the signals to evaluate. According to one embodiment of the apparatus, the delay line and the FSM form part of a forwarded-clocked interface implementation. According to one embodiment of the apparatus, the FSM is further configured to receive a freeze signal and is responsive to the received freeze signal to store the generated code, wherein the FSM is further configured to subsequently provide the stored generated code to the delay line to enable expedited adjustment of the recovered clock signal after a power saving mode.

Another embodiment provides a method that includes: determining, by a digital clock placement engine, a first time between a rising edge of a first clock signal and a rising edge of a second clock signal; determining, by the digital clock placement engine, a second time between a falling edge of the first clock signal and the rising edge of the second clock signal; comparing, by the digital clock placement engine, the determined first time to the determined second time; and if the comparing determines that the first and second times are different, adjusting, by the digital clock placement engine, the second clock signal until the first and second times are at least approximately equal.

According to one embodiment of the method, the adjusting the second clock signal includes increasing or decreasing a delay of the rising edge of the second clock signal. According to one embodiment, the method further includes: determining a high time and a low time of the second clock signal; comparing the determined high and low times of the second clock signal; and if the comparing determines that the high and low times of the second clock signal are different, increasing or decreasing a delay of a falling edge of the second signal until the high and low times are at least approximately equal.

According to one embodiment of the method, the adjusting the second clock signal until the first and second times are at least approximately equal includes: placing the rising edge of the second clock signal in a middle between the rising edge of the first clock signal and the falling edge of the first clock signal; and placing a falling edge of the second clock signal a middle between the falling edge of the first clock signal and a next rising edge of the first clock signal; wherein the method further comprises triggering sampling of a data signal based on the rising edge of the second signal as placed and based on the falling edge of the second signal as placed.

Another embodiment provides a system that includes: a receiver circuit configured to receive a first clock signal and a data signal that corresponds to the received first clock signal; a clock placement engine coupled to the receiver circuit and configured to generate a second clock signal having rising and falling edges that are positioned relative to edges of the received clock signal; and circuitry coupled to the clock placement engine to receive the second clock signal and to the receiver circuit to receive the data signal, wherein the circuitry is configured to sample the data signal according to the positioned rising and falling edges of the second clock signal.

According to one embodiment of the system, the receiver circuit forms part of a forwarded-clocked interface implementation. According to one embodiment of the system, the clock placement engine includes digital circuits.

According to one embodiment of the system, the clock placement engine includes: a delay line configured to receive the first clock signal from the receiver circuit and to output the second clock signal, the delay line further being configured to adjust timing of the rising and falling edges of the second clock signal relative to the edges of the first clock signal; and a finite state machine (FSM) coupled to the delay line and configured to generate a code and to provide the generated code to the delay line to control an amount of delay provided by the delay line to occurrences of the rising and falling edges of the second clock signal.

According to one embodiment of the system, the clock placement engine further includes: a first measurement structure coupled to the delay line and to the FSM, and configured to monitor a duty cycle of the second clock signal that is output by the delay line and to provide a first output to the FSM that represents the monitored duty cycle; and a second measurement structure coupled to the delay line and to the FSM, and configured to monitor edge placement of the second clock signal relative to the first clock signal and to provide a second output to the FSM that represents the monitored edge placement; wherein the FSM is responsive to the first and second outputs to generate the code to control the amount of delay provided by the delay line.

According to one embodiment of the system, the clock placement engine is configured to generate the second clock signal having rising and falling edges that are each positioned in a middle between rising and falling edges of the first clock signal, wherein the second clock signal has a 50% duty cycle.

Another embodiment provides an apparatus that includes: digital circuitry configured to receive a first clock signal and to generate a second clock signal from the first clock signal, wherein a rising edge or a falling edge of the second clock signal is in an approximately equidistant position from consecutive edges of the first clock signal; and monitor circuitry coupled to the digital circuitry and configured to monitor a duty cycle and a position of the second clock signal relative to the first clock signal, and further configured to provide outputs representative of the monitored duty cycle and placement to the digital circuitry to enable the digital circuitry to adjust the second clock signal until the approximately equidistant position is reached.

According to one embodiment of the apparatus, the digital circuitry includes: a delay line configured to receive the first clock signal and to output the second clock signal; and a finite state machine (FSM) coupled to receive the outputs from the monitor circuitry and coupled to the delay line, and configured to generate a code and to provide the generated code to the delay line to adjust the second clock signal. According to one embodiment of the apparatus, the FSM is further configured to receive a freeze signal to store the generated code and to subsequently use the stored generated code after a power saving mode to expedite adjustment of the second clock signal. According to one embodiment of the apparatus, the digital circuitry is further configured to independently control insertions of delays into the rising edge and the falling edge of the second clock signal. According to one embodiment of the apparatus, the delay line is configured to be adjusted to provide an updated starting position of the second clock signal relative to the first clock signal if an invalid starting condition is detected.

Referring first to FIG. 1, shown generally at 100 is an embodiment of a system in which a clock placement engine 102 may be implemented to provide a recovered clock signal having an improved duty cycle and an adjusted placement of its rising/falling edges relative to a data signal and/or relative to another signal, such as a received clock signal. The system 100 of one embodiment may include a "forwarded clock interface" implementation in which a clock signal is sent along with the data signal, if data is communicated from a transmitter end to a receiver end. Other embodiments of the system 100 can include other types of electronic systems that do not necessarily use forwarded clock interface techniques—in such other systems, some of the embodiments disclosed herein may be used to provide a clock signal having an adjusted duty cycle and/or location of rising/falling edges.

At the transmitter end, a clock signal CLK is generated and provided as input into a driver 104. The clock signal may have a duty cycle of 50% (e.g., has ½ "high time" and ½ "low time" per cycle) in one embodiment. In other embodiments, the clock signal CLK may have a duty cycle other than 50%. The clock signal CLK is also used as an input to a latch circuit 106, which outputs a particular data bit (e.g., 1 of N data bits) that collectively form a data signal in response to the clock signal CLK. The data signal having the data bits are provided as input into a driver 108 coupled to the latch circuit 106. The drivers 104 and 108 may be different devices in one embodiment, and may be the same devices in another embodiment.

In one embodiment, the drivers 104 and 108, the latch circuit 106, and other components (not shown) at the transmitter end may be provided on an integrated circuit (IC) chip. The components at the receiver end may also be formed on another IC chip, such that a bus 110 or other wired link enables the clock signal CLK to be received by the receiver end via the bus 110. In a generally similar manner, one or more links 112 (up to N links, for example) enables the bits of the data signal to be communicated from the driver 108 to the receiver end. Thus, a chip-to-chip configuration may be provided in the system 100.

In one embodiment, the combination of the latch circuit 106 and the driver 108 may be replicated in place of the driver 104, so as to create a system 100 where the clock signal CLK forwarded on the bus 110 and the data signal sent in the link(s) 112 have identical physical and electrical characteristics. In this manner, the clock signal CLK can be used as a proxy for the data signal, thereby allowing the clock placement engine 102 to optimize the clock placement for data by using only the clock signal CLK forwarded on the bus 110 as a reference.

In one embodiment, the bus 110 and the link(s) 112 are matched in length so as to facilitate identical signal propagation and timing from the transmitter end to the receiver end.

In other embodiments of the system 100, the communication between the transmitter end and the receiver end may be contained within a single chip (e.g., the components of the transmitter end and the receiver end are located on the same chip), the links 110/112 may be wireless links, or a combination of single or multiple chips, wired links, and wireless links.

The receiver end of one embodiment includes a receiver circuit 114 communicatively coupled to the bus 110 and configured to receive a clock signal CLKIN forwarded from the transmitter end. The forwarded/received clock signal CLKIN of one embodiment is a delayed version of the clock signal CLK, wherein the condition of the clock signal CLKIN may be degraded by jitter, aging, skew, process variations, temperature or other environmental conditions, and/or other factors that can cause a signal to be corrupted or distorted.

The receiver circuit 114 has an output terminal coupled to an input terminal of the clock placement engine 102, so as to provide the received clock signal CLKIN as an input to the clock placement engine 102. As will be described later below, the clock placement engine 102 generates and outputs a recovered clock signal CLK_REC, which has had its duty cycle and timing of its rising/falling edges adjusted relative to the received clock signal CLKIN, which tracks or otherwise corresponds in timing to the data signal received at the receiver end.

A receiver circuit 116 (which may be the same as the receiver circuit 114) at the receiver end also receives the bits of the data signal via the links 112 coupled thereto. The receiver circuit 116 provides the received data signal as an input into an input terminal of a circuit 118 and/or other circuitry (including a sample and hold circuit). The circuit 118 also has an input terminal coupled to an output terminal of the clock placement engine 102 to receive the recovered clock signal CLK_REC as an input, and is responsive to the recovered clock signal CLK_REC to sample the data signal so as to recover (and provide as output) the data bits contained therein. In one embodiment, the circuit 118 may be a simple latch circuit. In another embodiment, the circuit 118 can be any other type of data sampling circuitry or device including, but not limited to, a strong arm latch, a flip-flop, etc.

Figure 2:
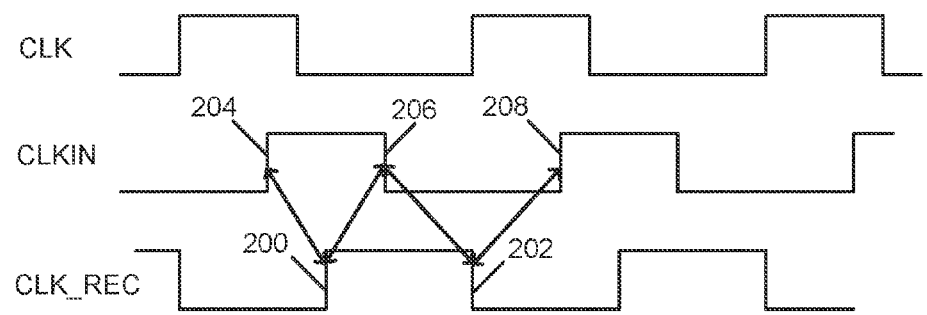
FIG. 2 is a signal diagram showing an example recovered clock signal that can be provided by the clock placement engine of FIG. 1, in accordance with one embodiment.

FIG. 2 shows signal diagrams of the clock signal CLK, the received clock signal CLKIN, and the recovered clock signal CLK_REC provided by the clock placement engine 102 of one embodiment. The signal diagrams of FIG. 2 are intended to illustrate the relative relationships between these three clock signals.

Beginning first with the clock signal CLK (generated by and sent from the transmitter end), the clock signal CLK may have a particular duty cycle. In the example of FIG. 2, the clock signal CLK does not have a 50% duty cycle, and so the low time of the clock signal CLK has a longer duration than its high time.

The received clock signal CLKIN may be a delayed version of the clock signal CLK, having been delayed (a phase shift to the right) by the driver 104, the bus 110, the receiver circuit 114, and/or other devices or mechanisms that induce delay. In general in one embodiment, the received clock signal CLKIN may have the same duty cycle as the clock signal CLK, such as a low time that has a longer duration that its high time in this example.

In another embodiment, the received clock signal CLKIN may not have the same duty cycle as the clock signal CLK, with the duty cycle having been altered by elements in the transmission path or other external factors. Furthermore in one embodiment, the received clock signal CLKIN may track the data signal, for example by having a same phase alignment as the data signal. This occurs, for instance, because the clock signal CLK was used at the transmitter end to generate the bits of the data signal, and the same factor(s) that caused the clock signal CLK to be delayed will also similarly delay the data signal—as a result, the received version (CLKIN) of the clock signal CLK will track or otherwise represent the data signal after the receiver circuit 116.

The recovered clock signal CLK_REC of one embodiment has rising edges 200 and falling edges 202, such that the duration of the high time is measured between consecutive rising edge 200 and falling edge 202, while the duration of the low time is measured between falling edge 202 and an immediately adjacent or next rising edge. The durations of the high/low times between the rising edges 200 and the falling edges 202 in each cycle determine the duty cycle of the recovered clock signal CLK_REC.

In one embodiment, the clock placement engine 102 is configured to generate the recovered clock signal CLK_REC such that the rising edge 200 is located between consecutive rising edge 204 and falling edge 206 of the received clock signal CLKIN. Furthermore, the clock placement engine 102 is configured to generate the recovered clock signal CLK_REC such that the falling edge 202 is located between consecutive falling edge 206 and (next) rising edge 208 of the received clock signal CLKIN.

With this placement/timing/adjustment of at least one of the rising edges 200 and the falling edges 202 of the recovered clock signal CLK_REC, the rising edge 200 of the recovered clock signal CLK_REC can be placed at least approximately in the middle of the high time between the rising edge 204 and the falling edge 206 of the received clock signal CLKIN, and the falling edge 202 of the recovered clock signal CLK_REC can be placed at least approximately in the middle of the low time between the falling edge 206 and the next rising edge 208 of the received clock signal CLKIN. In one embodiment, the rising edge 200 and the falling edge 202 of the recovered clock signal CLK_REC may be placed/timed at exactly in the middle of the high time and low time, respectively, of the received clock signal CLKIN.

In another embodiment, the rising edge 200 and the falling edge 202 of the recovered clock signal CLK_REC may be placed/timed at before or after the exact middle of the high time and low time, respectively, of the received clock signal CLKIN. Various factors, including but not limited to the choice of the circuit 118 may dictate the best placement and timing of the recovered clock signal CLK_REC, such as approximately at the middle or elsewhere.

Moreover in one embodiment, placing the rising edges 200 and the falling edges 202 of the recovered clock signal CLK_REC at these locations relative to the received clock signal CLKIN (and hence also relative to the corresponding locations in the data signal) enables the duty cycle of the recovered clock signal CLK_REC to "self-adjust" to a 50% duty cycle. In effect, therefore, placing the rising edges 200 and the falling edges 202 of the recovered clock signal CLK_REC at these locations relative to the received clock signal CLKIN amounts to a quadrature or 90-degree phase shift (e.g., a forward or reverse delay by 90 degrees where a full clock period represents 360 degrees).

The placement of the rising edges 200 and the falling edges 202 of the recovered clock signal CLK_REC at these locations relative to the received clock signal CLKIN is useful in an embodiment where the data signal is to be sampled based on both (e.g., triggered by) the rising and falling edges of the recovered clock signal CLK_REC. Since the received clock signal CLKIN tracks or otherwise corresponds to the data signal, the above-described "middle-placement" of the rising/falling edges of the recovered clock signal CLK_REC enables the sampling (performed at each rising/falling edge of the recovered clock signal CLK_REC) to be maximally distant from a potential rising/falling edge of the data signal, thereby reducing or otherwise minimizing the possibility of erroneous sampling (e.g., missed samplings, mistimed samplings, etc.). For example, with the timing of the rising/falling edges of the recovered clock signal CLK_REC as shown, the chances of obtaining an inconclusive sample value at or near a rising/falling edge of the data signal is reduced.

According to one embodiment, the clock placement engine 102 has circuitry/hardware that includes:

(1) A digitally controlled delay line (main delay line) that is configured to perform clock edge placement and duty cycle correction with minimum insertion delay. An embodiment of the main delay line will be described later below.

(2) A first measurement structure configured to measure or otherwise monitor the duty cycle of the recovered clock signal CLK_REC.

(3) A second measurement structure configured to measure or otherwise monitor the placement of the recovered clock signal CLK_REC with respect to the received clock signal CLKIN.

(4) A finite state machine (FSM) configured to process respective first and second outputs of the measurement structures in (2) and (3) above, and use these outputs to control the main delay line from (1) above, for example by generating a code to cause the delay line to select a particular delay value. The FSM will be described later below as well.

Figure 3:
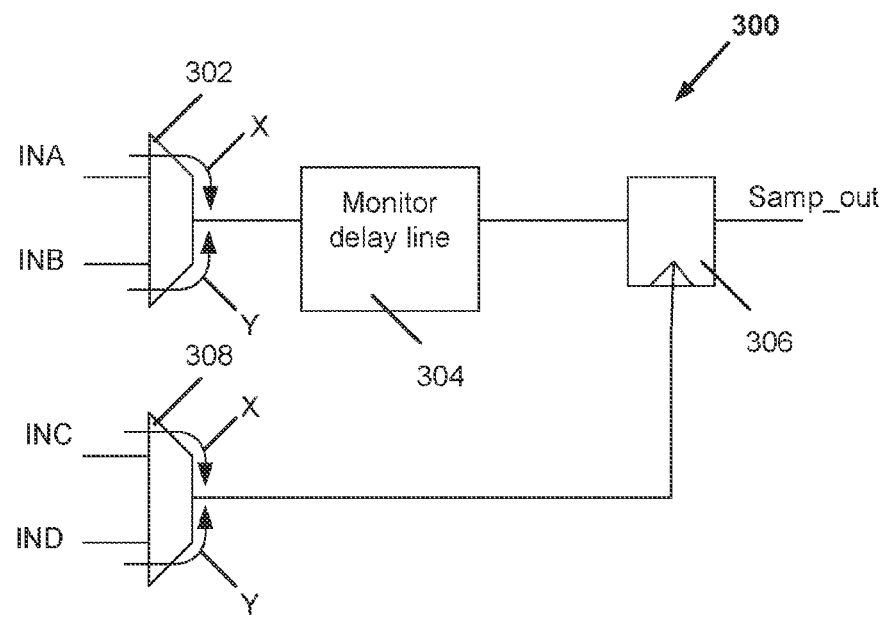
FIG. 3 is a diagram of an embodiment of a measurement structure that can be used in the clock placement engine of FIG. 1.

With respect to the first and second measurement structures of (2) and (3) above, FIG. 3 shows an embodiment of a measurement structure 300 that can be used in the clock placement engine 102. The measurement structure 300 includes a first multiplexer 302 having first and second input terminals to respectively receive signals INA and INB. An output terminal of the first multiplexer 302 is coupled to an input terminal of a monitor delay line 304, which is configured to add a time delay to the signal that is output from the first multiplexer 302.

The output terminal of the monitor delay line 304 is coupled to an input terminal of a latch circuit 306. The latch circuit 306 is in turn configured to sample the signal(s) at its input terminal(s) and then output a sample Samp_out at its output terminal.

The measurement structure 300 further includes a second multiplexer 308 having first and second input terminals to respectively receive signals INC and IND. An output terminal of the second multiplexer 308 is coupled to another input terminal of the latch circuit 306.

An example operation of one embodiment of the measurement structure 300 will now be described generally with respect to the signals INA, INB, INC, and IND shown in FIG. 4. Later below, the signals INA, INB, INC, and IND will be more specifically equated with the various clock signals shown in FIG. 2 (and FIG. 5). It is noted herein that FIG. 4 shows two sets of signal diagrams (a first set shows the relationship/comparison between the signal INA and the signal INC, and the second set shows the relationship/comparison between the signal INB and the signal IND)—these two sets of signal diagrams are not intended to be shown in FIG. 4 as having a same/common time scale from one set to another set.

Figure 4:
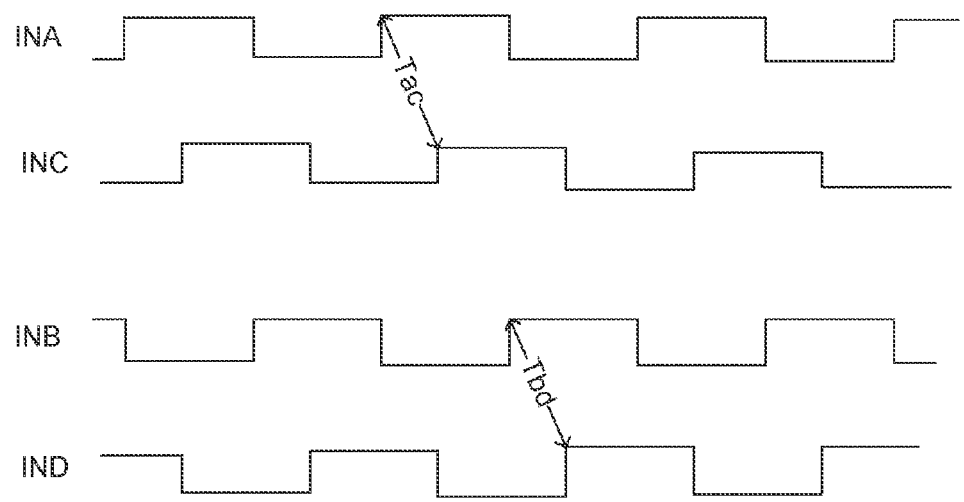
FIG. 4 shows two sets of signal diagrams illustrating operation of the measurement structure of FIG. 3, in accordance with one embodiment.

In the example of FIG. 4, the measurement structure 300 is configured to compare a time Tac (which is a time between a rising edge of the signal INA rising and a rising edge of the signal INC) to a time Tbd (which is a time between a rising edge of the signal INB and a rising edge of a signal IND). In one embodiment, the signal INA may be the received clock signal CLKIN and the signal INC may be recovered clock signal CLK_REC, and both provide rising edges for the measurement (at Tac). In one embodiment, the signal INB may be an inversion of the recovered clock signal CLK_REC that is then inverted before being sent through the first multiplexer 302, and the signal IND may be the clock signal CLKIN that is also inverted before being sent through the second multiplexer 308. Therefore, for the INB to IND measurement (at Tbd), the incoming edges are falling, but they are both inverted for the measurement if the measurement structure 300 of one embodiment performs measurements based on rising edges.

The operation of one embodiment of the measurement structure 300 to evaluate versions of the various signals INA, INB, INC, and IND with each other may be as follows:

For some number of clock cycles, the first multiplexer 302 and the second multiplexer 308 are set (by a selection input signal), described later in FIG. 7) to select a path X. A value of the output Samp_out of the latch circuit 306 for this selection configuration is Samp_out_X.

Subsequently, the first multiplexer 302 and the second multiplexer 308 are set (by the selection input signal) to select a path Y. A value of the output Samp_out of the latch circuit 306 for this selection configuration is Samp_out_Y.

The following example control behaviors indicate how to process the samples (output by the latch circuit 306) in terms of comparing (and eventually equalizing) the times Tac and Tbd:

Samp_out_Y=0 and Samp_out_X=1 implies that Tac>Tbd;

Samp_out_Y=1 and Samp_out_X=0 implies that Tbd<Tac;

Samp_out_Y=0 and Samp_out_X=0 implies that the time delay provided by the monitor delay line 304 should be decreased in order to enable the measurement structure 300 to distinguish between the times Tac and Tbd; and Samp_out_Y=1 and Samp_out_X=1 implies that the time delay provided by the monitor delay line 304 should be increased in order to enable the measurement structure 300 to distinguish between the times Tac and Tbd.

With more specific reference now to the clock signals CLKIN and CLK_REC in view of the signal diagrams of FIG. 4 and as previously explained above for one embodiment, the signal INA can be considered to be the received clock signal CLKIN; the signal INC can be considered to be the recovered clock signal CLK_REC; the signal INB can be considered to be an inverse/complement of a recovered complementary clock signal CLKX_REC (two inversions from the recovered clock signal CLK_REC), and the signal IND can be considered to be the inverse/complement of the received clock signal CLKIN.

As previously explained above, the clock placement engine 102 of one embodiment employs two instances (2) and (3) of the measurement structure 300 of FIG. 3. The first instance (2) discussed above is used to compare the durations of the high and low times of the recovered clock signal CLK_REC, so that the duty cycle of the recovered clock signal CLK_REC can be regulated to a 50% duty cycle, for example. This determination/monitoring/measurement of the duty cycle of the recovered clock signal CLK_REC can be performed in one embodiment, for example, by appropriately choosing the path(s) X or Y in the first multiplexer 302 and the second multiplexer 308 so that the signals INA and INC are the inverse/compliment of the recovered clock signal CLK_REC and the signals INB and IND are the true sense of the recovered clock signal CLK_REC. Further simplification can be made in another embodiment so that the second multiplexer 308 is eliminated and the first multiplexer 302 drives both the monitor delay line 304 and the clock pin of the latch circuit 306 (which may be a sampler). The value of the output Samp_out may be used in one embodiment of the FSM of (4) above to calculate or otherwise determine the duty cycle of the recovered clock signal CLK_REC.

Figures 5, 6:
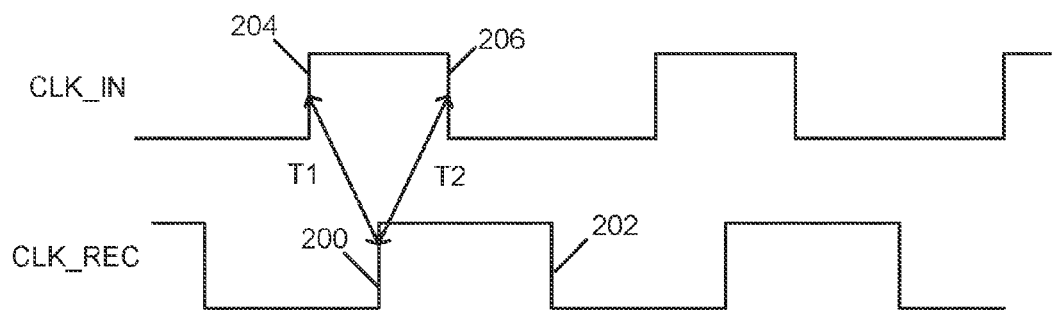
FIG. 5 is a signal diagram showing time periods, between the recovered clock signal and a reference/received clock signal, that can be measured using the structure of FIG. 3, in accordance with one embodiment.
FIG. 6 is a table that represents one embodiment of a method that can be performed by the clock placement engine to adjust the duty cycle and placement of rising/falling edges of the recovered clock signal, in accordance with one embodiment.

The second instance (3) discussed above of the measurement structure 300 of FIG. 3 is used in one embodiment to compare the times T1 and T2 shown in FIG. 5. Time T1 is the time difference between the rising edge 204 of the received clock signal CLKIN and the rising edge 200 of the recovered clock signal CLK_REC, and may for example be considered as the time Tac shown in FIG. 4. Time T2 is the time difference between the falling edge 206 of the received clock signal CLK_IN and the rising edge 200 of the recovered clock signal CLK_REC, and may for example be considered as the time Tbd shown in FIG. 4.

In one embodiment with respect to FIG. 5, the techniques disclosed herein to provide a more optimum duty cycle and/or edge placement of the recovered clock signal CLK_REC relative to the received clock signal CLKIN are based on an assumption that the starting position of the rising edge 200 of the recovered clock signal CLK_REC occurs during the high time of the received clock signal CLKIN and that the starting position of the falling edge 202 of the recovered clock signal CLK_REC occurs during the low time of the received clock signal CLKIN. Various circuits/techniques may be used to provide these starting positions. For example in one embodiment, appropriate starting positions may be provided by the clock placement engine 102 detecting an invalid starting condition using various circuits/techniques and adjusting the main delay line (1) until the proper/updated starting conditions are reached.

In one embodiment, the FSM of (4) above and discussed later below is configured to read the value of the output Samp_out from either one or both of the instances (2) and (3) of the measurement structure 300. For example, the FSM may digitally filter each series of samples (provided by the output Samp_out from the latch circuit 306) to determine which of the following one or more actions shown in a table 600 of FIG. 6 may be taken.

Figure 7:
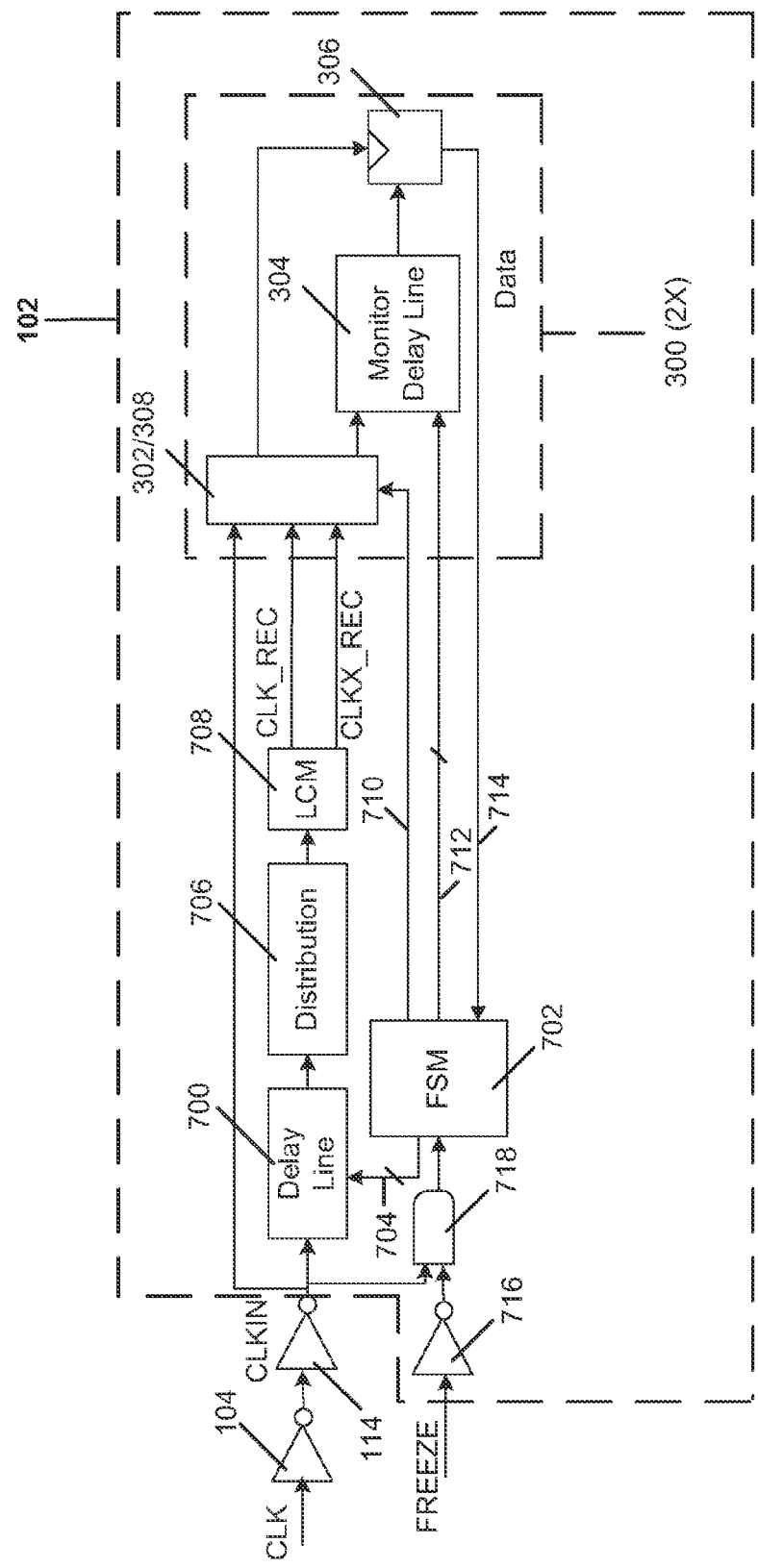
FIG. 7 is a block diagram showing additional details of the clock placement engine of FIG. 1, in accordance with one embodiment.

The table 600 shows the example decisions made by a duty cycle sentinel (DCS) that may be embodied by the first instance (2) of the measurement structure 300 that measures the duty cycle of the recovered clock signal CLK_REC; the decisions made by a quadrature lock sentinel (QLS) that may be embodied by the second instance (3) of the measurement structure 300 that determines the placement of the recovered clock signal CLK_REC with respect to the received clock signal CLKIN; and the corresponding action/reaction of the main delay line (1), which is shown at 700 in FIG. 7.

The decision(s) made by the DCS is whether the low time of the recovered clock signal is too large or too small. The decision(s) made by the QLS is whether T1<T2 or T1>T2. The action/reaction of the main delay line may be to do nothing, cause the rising time of the recovered clock signal CLK_REC to occur earlier or later ("R early" or "R later"), cause the falling time of the recovered clock signal CLK_REC to occur earlier or later ("F early" or "F later"), etc. as shown in the Table 600.

In the table 600, a "1" means "true" and a "0" means "false." In situations such as at lines 602 and 604, where the decisions of the DCS are both indicated as "0", this represents that there is insufficient information about the duty cycle of the recovered clock signal CLK_REC, and so the main delay line will make edge placement adjustments based on the determinations made by the QLS only. Analogously, in situations such as at lines 606 and 612, where the decisions of the QLS are both indicated as "0", this represents that insufficient information about T1 and T2 is available, and so the main delay line will make duty cycle adjustments based on the determinations made by the DCS only.

In other embodiments, variations of the table 600 may be provided, including different or other types of actions, different or other decisions/results from the DCS and QLS, different or other elements providing the decisions and actions, or other differences or variations from what is specifically shown in FIG. 6. Accordingly, the specific format and content of the table 600 of FIG. 6 are intended to be examples and it is understood that variations are possible.

Now with reference to FIG. 5 and the specific lines 602-616 of the table 600 shown in FIG. 6:

If T1<T2, the rising edge 200 is caused to delayed only if there is no information about the duty cycle available (line 604) or if the CLK_REC low time is too small (line 610). With this action, the rising edge 200 of the recovered clock signal CLK_REC is thus shifted/delayed to the rightward direction in FIG. 5;

If T1<T2 and the CLK_REC low time is too large (line 616), only the falling edge 202 of the recovered clock signal CLK_REC is thus shifted/delayed to the rightward direction in FIG. 5;

At line 612, the delay line increases the falling insertion delay of the recovered clock signal CLK_REC, if the high time of the recovered clock signal CLK_REC<the low time of the recovered clock signal CLK_REC and no information is able to be deduced regarding T1 versus T2. With this action, a duty cycle adjustment is performed so that the high time of the recovered clock signal CLK_REC is extended (thereby resulting in a rightward shift/delay of the falling edge 202 in FIG. 5) so to be more equal in duration to the low time of the recovered clock signal CLK_REC);

If T1>T2, the delay of the falling edge 202 is reduced only if there is no information about the duty cycle available (line 602) or if the CLK_REC low time is too small (line 608). With this action, the falling edge 202 of the recovered clock signal CLK_REC is thus shifted to the leftward direction (reduced delay) in FIG. 5;

If T1>T2 and the CLK_REC low time is too large (line 614), only the rising edge 200 of the recovered clock signal CLK_REC is thus shifted to the leftward direction (reduced delay) in FIG. 5;

At line 606, the delay line decreases the falling insertion delay of the recovered clock signal CLK_REC, if the high time of the recovered clock signal CLK_REC high time>the low time the recovered clock signal CLK_REC and no information can be deduced regarding T1 versus T2. With this action, a duty cycle adjustment is performed so that the high time of the recovered clock signal CLK_REC is shortened (thereby resulting in a leftward shift of the falling edge 202);

In one embodiment, if samples provided by the output Samp_out for both paths X and Y (see, e.g., FIG. 3 for the instance of the measurement structure 300) have the same polarity, then the delay value of the monitor delay line 304 is adjusted for the first instance (2) of the measurement structure 300 that is tracking the duty cycle of the recovered clock signal CLK_REC. For example, if the output samples are both binary 0, then the delay value is decreased, and if the output samples are both binary 1, then the delay value is increased; and In one embodiment, if samples provided by the output Samp_out for both paths X and Y (see, e.g., FIG. 3 for the instance of the measurement structure 300) have the same polarity, then the delay value of the monitor delay line 304 is adjusted for the second instance (3) of the measurement structure 300 that is tracking the relative placement of the recovered clock signal CLK_REC with respect to the received clock signal CLKIN. For example, if the output samples are both binary 0, then the delay value is decreased, and if the output samples are both binary 1, then the delay value is increased.

The above-described actions pertaining to the table 600 are based in one embodiment on the control behavior of the measurement structure 300 as previously and generically explained above with respect to the signals INA, INB, INC, and IND and times Tac and Tbd shown in FIG. 4. The actions represented in the table 600 allow the clock placement engine 102 of one embodiment to converge with the optimal timing placement of the recovered clock signal CLK_REC so as to enable data to be sampled in the center or approximate center of a sampling window.

In one embodiment, one or more of the actions represented in the table 600 may be repeated if appropriate to arrive at an optimal placement location of the recovered clock signal CLK_REC relative to the received clock signal CLKIN (such as by placing/timing the rising/falling edges of the recovered clock signal CLK_REC to be "in the middle between" (equidistant from) the rising/falling edges of the received clock signal CLKIN) and/or to obtain an appropriate duty cycle (such as a 50% duty cycle) of the recovered clock signal CLK_REC. In one embodiment, certain ones of the actions by the delay line may be omitted or need not necessarily occur in any particular order.

FIG. 7 shows one embodiment of the clock placement engine 102 in more detail, including the components that perform the various operations shown and described above with respect to FIGS. 2-6. For context, some of the other components of the system 100 of FIG. 1 that operate with the clock placement engine 102 are also shown in FIG. 7.

As previously explained above, one embodiment of the clock placement engine 102 includes the four components: (1) a main delay line (shown at 700 in FIG. 7 and whose actions are indicated in the table 600 of FIG. 6) configured to perform clock edge placement and duty cycle correction with minimum insertion delay; (2)-(3) first and second instances (2×) of the measurement structure (shown at 300 in FIGS. 3 and 7) to respectively monitor the duty cycle of the recovered clock signal CLK_REC and monitor the placement/timing of rising/falling edges of the recovered clock signal CLK_REC with respect to the received clock signal CLKIN; and (4) a FSM (shown at 702 in FIG. 7) configured to process the outputs of the two instances of the measurement structures 300.

The main delay line 700 receives as input the received clock signal CLKIN from the receiver circuit 114 and outputs the recovered clock signal CLK_REC. The delay line 700 inserts a time delay into the recovered clock signal CLK_REC, and in one embodiment, the delay line 700 is responsive to two different digital control words that control the rising and falling insertion delays independently. In an embodiment, the FSM 702 is coupled to the delay line 700 to provide the control words or other code, via one or more lines 704. The delay line 700 is responsive to the control words to change/select its delay value, which is usable by the delay line 700 to adjust the timing of at least one edge of the recovered clock signal CLK_REC. Therefore, via the use of the control words provided to the delay line 700, the FSM 702 of one embodiment is able increase/decrease/change the rising/falling insertion delays introduced by the delay line 700 into the recovered clock signal CLK_REC (as represented in the table 600 of FIG. 6) so as to control the edge placement and/or duty cycle of the recovered clock signal CLK_REC.

In an embodiment, an output terminal of the delay line 700 can be coupled to an input terminal of a distribution block 706. An output terminal of the distribution block 706 may in turn be coupled to an input terminal of a local clock macro (LCM) block 708. The distribution block 706 of one embodiment may be configured to route to a plurality of data bits up to a value of N. The distribution block 706 of one embodiment may include a network that receives a single clock signal, and through a series of length-matched segments, spreads that clock signal over a distance to arrive at a set of data receivers, all at the same time. At the data receivers, the LCM block 708 is configured to receive the clock signal. The LCM block 708 is configured to change the clock signal from a single clock signal to a differential pair of clock signals CLK_REC and CLKX_REC. The LCM block 708 outputs the recovered clock signal CLK_REC and its inverse/complement CLKX_REC.

The clocks signals CLK_REC, CLKX_REC, CLKIN, and the inverse/complement of CLKIN may in turn be provided as inputs to the first and second multiplexers 302 and 308 of both instances of the measurement structure 300. The multiplexers 302 and 308 may in turn be coupled to the FSM 702 to receive selection input signals via one or more lines 710. The selection input signals sent on the line(s) 710 can include, for example, a signal to select the X and Y paths explained above with respect to FIG. 3 et seq.

The monitor delay line 304 of the two instances of the measurement structure 300 is coupled to the FSM 702 to receive a code or other instruction via one or more lines 712. Such code from the FSM 702 instructs the monitor delay line to adjust its delay value that is usable for purposes of adjusting the duty cycle and/or placement of the recovered clock signal, in accordance with the table 600 in FIG. 6.

The latch circuit 306 of one embodiment has its output terminal (which provides the output Samp_out) coupled to an input terminal of the FSM 702 via one or more lines 714. As such, the FSM 702 is able to determine the values of the times T1, T2, high/low times of the recovered clock signal CLK_REC, polarity of the samples, etc. based on the sample data value in the output Samp_out, so as to perform the various actions shown in the table 600 of FIG. 6.

According to one embodiment, the FSM 702 may differentially filter the samples from the two measurement structures 300 so that the time T1 versus time T2 samples have less filtering (faster response) than the duty cycle samples of the recovered clock signal CLK_REC.

In one embodiment, a FREEZE signal may be provided as another input to the FSM 702 by way of an inverter/driver 716 and a logic gate (such as an AND gate) 718, which in turn also receives the received clock signal CLKIN as an input. The output terminal of the logic gate 718 is coupled to the FSM 702. With this configuration, the FSM 702 can be responsive to the FREEZE signal to "freeze" operation.

In one embodiment, the FREEZE signal can cause the FSM 702 to store the codes that have been generated for the main delay line 700 in preparation for a power savings event such as a power down. Thereafter, a quicker restart, from power savings modes where clocks have been halted for arbitrarily long periods of time, can be enabled such that the stored codes are used to expedite the adjustment of the duty cycle and/or placement of the rising/falling edges of the recovered clock signal CLK_REC.

In one embodiment, the FREEZE signal can halt the operation of the FSM 702 as a power savings measure. Once the clock placement engine 102 has determined the codes for the delay line 700, the FSM 702 can be frozen to save power and the edge placement remains intact since the delay codes are also frozen. In one embodiment, the FREEZE signal can periodically halt the operation of the FSM 702. If the clock placement engine 102 tracks changes in the recovered clock signal CLK_REC due to aging and temperature changes, then the clock placement engine 102 can be frozen and awakened for short intervals. During the short unfrozen interval(s), the clock placement engine 102 can make the appropriate delay value adjustments to the delay line 700, and the FSM 702 can be frozen again for power savings.

According to various embodiments, the FSM 702 may selectively update the delay value for the delay line 700, update the delay value for the monitor delay line 304, or hold current delay values. Further in one embodiment, the FSM 702 may include digital filters to dampen response jitter or other potential sources of error. The FSM 702 of one embodiment may further run continuously, update periodically, or freeze.

Embodiments of the clock placement engine 102 and other elements of the system 100 of FIG. 1 described herein may be used in a number of implementations and applications. For example, mobile devices, including but not limited to smart phones, nettops, tablets and other Mobile Internet Devices (MIDs) may have circuit(s) that would benefit from improved clock edge placement and/or duty cycle correction. In such implementations, the clock placement engine 102 may be used provide more optimal clocking for various operations, such as data sampling.

Figure 8:
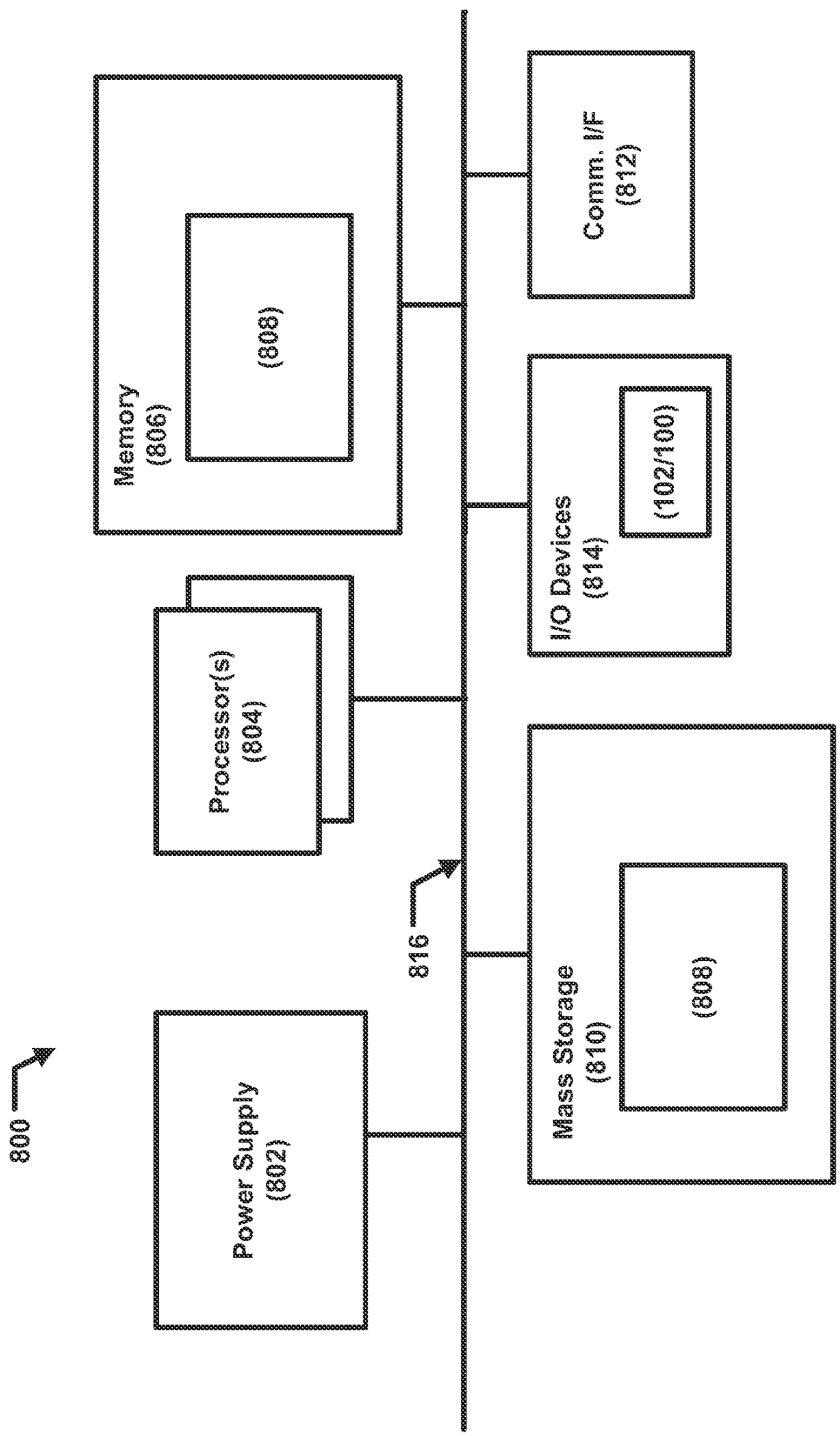
FIG. 8 is a block diagram that illustrates an example computer system suitable to practice the disclosed circuit and method to provide a clock signal with an adjusted duty cycle and placement of rising/falling edges, in accordance with various embodiments.

FIG. 8 is a block diagram that illustrates an example computer system 800 suitable to practice the disclosed aging monitor circuit/method of various embodiments.

As shown, the computer system 800 may include a power supply unit 802, a number of processors or processor cores 804, a system memory 806 having processor-readable and processor-executable instructions 808 stored therein, a mass storage device 810 that may also store the instructions 808, and a communication interface 812. For the purpose of this application, including the claims, the terms "processor" and "processor cores" may be considered synonymous, unless the context clearly requires otherwise.

In various embodiments of the present disclosure, at least one of the processors 804, including a controller, may generate or cause to be generated the clock signal CLK, the data signal, the FREEZE signal, and so forth. In other embodiments, various other components (internal or external to the system 800) may generate one or more of such signals.

The one or more mass storage devices 810 and/or the memory 806 may comprise a tangible, non-transitory computer-readable storage device (such as a diskette, hard drive, compact disc read only memory (CDROM), hardware storage unit, flash memory, phase change memory (PCM), solid-state drive (SSD) memory, and so forth). The instructions 808 stored in the mass storage devices 810 and/or the memory 806 may be executable by one or more of the processors 804 to perform or cause to be performed the operations depicted in the method 600 of FIG. 6, for example.

The computer system 800 may also comprise input/output devices 814 (such as a keyboard, display screen, cursor control, and so forth). In various embodiments and purely by way of example, the I/O devices 814 may themselves include the clock placement engine 102 and other components of the system 100, such as shown by way of example in FIG. 8. The clock placement engine 102 or other components of the system 100 may alternatively or additionally be located elsewhere in the computer system 800, and may comprise part or all of an integrated circuit.

The various elements of FIG. 8 may be coupled to each other via a system bus 816, which represents one or more buses. In the case of multiple buses, they may be bridged by one or more bus bridges (not shown). Data may pass through the system bus 816 through the I/O devices 814, for example, between the clock placement engine 102 and the processors 804. The data signal on the link(s) 112 together with the forwarded clock signal CLKIN on the bus 110 may also be sent between discrete chips on a Multi-Chip Package (MCP). In one embodiment, such MCP could represent one or more processors 804 or any other component of system 800. In one embodiment a portion or all of the memory 806 could be integrated on an MCP with one or more processors 804. In one embodiment, one or more chips in system 800 may have a clock placement engine 102.

The system memory 806 and the mass storage device 810 may be employed to store a working copy and a permanent copy of the programming instructions implementing one or more operating systems, firmware modules or drivers, applications, and so forth, herein collectively denoted as 808. The permanent copy of the programming instructions may be placed into permanent storage in the factory, or in the field, through, for example, a distribution medium (not shown), such as a compact disc (CD), or through the communication interface 812 (from a distribution server (not shown)).

According to various embodiments, one or more of the depicted components of the system 800 and/or other element(s) may include a keyboard, LCD screen, non-volatile memory port, multiple antennas, graphics processor, application processor, speakers, or other associated mobile device elements, including a camera.

The remaining constitution of the various elements of the computer system 800 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, specific types of logic gates and/or logic configurations, and so forth. In other embodiments, different configurations can be provided in view of whether or not certain signals are inverted, whether certain changes in state are triggered in response to falling edges instead of rising edges or vice versa, different logic gate configurations, and so forth.

These and other modifications can be made in light of the above detailed description. The terms used in the following claims should not be construed to be limited to the specific embodiments disclosed in the specification.

What is claimed is:

1. An apparatus, comprising:
   a delay line configured to receive a clock signal and to output a recovered clock signal, the delay line having a delay value that is usable to adjust timing of at least one edge of the recovered clock signal relative to the received clock signal; and
   a finite state machine (FSM) coupled to the delay line and configured to generate a code and to provide the generated code to the delay line to select the delay value;
   a first instance of a measurement structure coupled to the delay line and to the FSM, and configured to monitor a duty cycle of the recovered clock signal that is output by the delay line and to provide a first output to the FSM that represents the monitored duty cycle; and
   a second instance of the measurement structure coupled to the delay line and to the FSM, and configured to monitor edge placement of the recovered clock signal relative to the received clock signal and to provide a second output to the FSM that represents the monitored edge placement;
   wherein the FSM is responsive to the first and second outputs to generate the code to provide to the delay line to select the delay value; and
   wherein the measurement structure includes first and second multiplexers configured to receive the versions of the received clock signal and of the recovered clock signal, and wherein the FSM is further configured to provide a selection signal to the first and second multiplexers to enable selection of particular versions of the signals to evaluate.

2. The apparatus of claim 1 wherein the delay line is configured to use the delay value to adjust timing of a rising edge and a falling edge of the recovered clock signal relative to the received clock signal.

3. The apparatus of claim 2 wherein:
   the delay line is configured to time the rising edge of the recovered clock signal to occur in a middle between a rising edge of the received clock signal and an immediate falling edge of the received clock signal; and
   the delay line is configured to time the falling edge of the recovered clock signal to occur in a middle between the falling edge of the received clock signal and an immediate rising edge of the received clock signal.

4. The apparatus of claim 1 wherein the delay line is configured to use the delay value to adjust a duty cycle of the recovered clock signal to a 50% duty cycle.

5. The apparatus of claim 1 wherein the measurement structure is configured to evaluate versions of the received clock signal alone or the received clock signal and the recovered clock signal with each other to generate the first and second outputs respectively.

6. The apparatus of claim 1 wherein the delay line and the FSM form part of a forwarded-clocked interface implementation.

7. The apparatus of claim 1 wherein the FSM is further configured to receive a freeze signal and is responsive to the received freeze signal to store the generated code, wherein the FSM is further configured to subsequently provide the stored generated code to the delay line to enable expedited adjustment of the recovered clock signal after a power saving mode.

8. A method, comprising:
determining, by a digital clock placement engine, a first time between a rising edge of a first clock signal and a rising edge of a second clock signal, wherein the first clock signal corresponds in phase to a data signal and the second clock signal is used to trigger sampling of the data signal;
determining, by the digital clock placement engine, a second time between a falling edge of the first clock signal and the rising edge of the second clock signal;
comparing, by the digital clock placement engine, the determined first time to the determined second time; and
if the comparing determines that the first and second times are different, adjusting, by the digital clock placement engine, the second clock signal until the first and second times are at least approximately equal.

9. The method of claim 8 wherein the adjusting the second clock signal includes increasing or decreasing a delay of the rising edge of the second clock signal.

10. The method of claim 8, further comprising:
determining a high time and a low time of the second clock signal;
comparing the determined high and low times of the second clock signal; and
if the comparing determines that the high and low times of the second clock signal are different, increasing or decreasing a delay of a falling edge of the second signal until the high and low times are at least approximately equal.

11. The method of claim 8 wherein the adjusting the second clock signal until the first and second times are at least approximately equal includes:
placing the rising edge of the second clock signal in a middle between the rising edge of the first clock signal and the falling edge of the first clock signal; and
placing a falling edge of the second clock signal a middle between the falling edge of the first clock signal and a next rising edge of the first clock signal;
wherein the method further comprises triggering sampling of the data signal based on the rising edge of the second signal as placed and based on the falling edge of the second signal as placed.

12. A system, comprising:
a receiver circuit configured to receive a first clock signal and a data signal that corresponds in phase to the received first clock signal;
a clock placement engine coupled to the receiver circuit and configured to generate a second clock signal having rising and falling edges that are positioned relative to edges of the received clock signal, wherein:
the clock placement engine is configured to time the rising edges of the second clock signal to occur halfway between a rising edge of the first clock signal and an immediate falling edge of the first clock signal; and
the clock placement engine is configured to time the falling edge of the second clock signal to occur halfway between the falling edge of the first clock signal and an immediate rising edge of the first clock signal; and
circuitry coupled to the clock placement engine to receive the second clock signal and to the receiver circuit to receive the data signal, wherein the circuitry is configured to sample the data signal according to the positioned rising and falling edges of the second clock signal;
wherein the clock placement engine includes:
a delay line configured to receive the first clock signal from the receiver circuit and to output the second clock signal, the delay line further being configured to adjust timing of the rising and falling edges of the second clock signal relative to the edges of the first clock signal; and
a finite state machine (FSM) coupled to the delay line and configured to generate a code and to provide the generated code to the delay line to control an amount of delay provided by the delay line to occurrences of the rising and falling edges of the second clock signal.

13. The system of claim 12 wherein the receiver circuit forms part of a forwarded-clocked interface implementation.

14. The system of claim 12 wherein the clock placement engine includes digital circuits.

15. The system of claim 12 wherein the clock placement engine further includes:
a first measurement structure coupled to the delay line and to the FSM, and configured to monitor a duty cycle of the second clock signal that is output by the delay line and to provide a first output to the FSM that represents the monitored duty cycle; and
a second measurement structure coupled to the delay line and to the FSM, and configured to monitor edge placement of the second clock signal relative to the first clock signal and to provide a second output to the FSM that represents the monitored edge placement;
wherein the FSM is responsive to the first and second outputs to generate the code to control the amount of delay provided by the delay line.

16. The system of claim 12 wherein the clock placement engine is further configured to generate the second clock signal having a 50% duty cycle.

17. An apparatus, comprising:
digital circuitry configured to receive a first clock signal and to generate a second clock signal from the first clock signal, wherein a rising edge or a falling edge of the second clock signal is in an approximately equidistant position from consecutive edges of the first clock signal; and
monitor circuitry coupled to the digital circuitry and configured to monitor a duty cycle and a position of the second clock signal relative to the first clock signal, and further configured to provide outputs representative of the monitored duty cycle and placement to the digital circuitry to enable the digital circuitry to adjust the second clock signal until the approximately equidistant position is reached;
wherein the digital circuitry includes:
a delay line configured to receive the first clock signal and to output the second clock signal; and
a finite state machine (FSM) coupled to receive the outputs from the monitor circuitry and coupled to the delay line, and configured to generate a code and to provide the generated code to the delay line to adjust the second clock signal; and
wherein the delay line is configured to be adjusted to provide an updated starting position of the second clock signal relative to the first clock signal if an invalid starting condition is detected.

18. The apparatus of claim 17 wherein the FSM is further configured to receive a freeze signal to store the generated code and to subsequently use the stored generated code after a power saving mode to expedite adjustment of the second clock signal.

19. The apparatus of claim 17 wherein the digital circuitry is further configured to independently control insertions of delays into the rising edge and the falling edge of the second clock signal.

* * * * *